United States Patent
Liao et al.

(10) Patent No.: US 11,340,288 B1
(45) Date of Patent: May 24, 2022

(54) TESTING EQUIPMENT, ITS COMPONENT CARRYING DEVICE AND TESTING METHOD OF THE TESTING EQUIPMENT

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Chih-Chieh Liao, Hsinchu (TW); Chih-Feng Cheng, Hsinchu (TW); Yu-Min Sun, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 9 days.

(21) Appl. No.: 17/155,040

(22) Filed: Jan. 21, 2021

(30) Foreign Application Priority Data

Dec. 7, 2020 (TW) .................................. 109143069

(51) Int. Cl.
*G01R 31/28* (2006.01)
(52) U.S. Cl.
CPC ..... *G01R 31/2875* (2013.01); *G01R 31/2867* (2013.01)
(58) Field of Classification Search
CPC .. G01R 1/0458; G01R 31/2884; G01R 1/073; G01R 1/07314; G01R 1/07328; G01R 31/2893
See application file for complete search history.

(56) References Cited

U.S. PATENT DOCUMENTS

| | | | | |
|---|---|---|---|---|
| 2002/0075024 A1* | 6/2002 | Fredeman | ............ | G01R 1/0458 324/750.05 |
| 2004/0032274 A1* | 2/2004 | Cader | ................ | G01R 31/2891 324/750.08 |

FOREIGN PATENT DOCUMENTS

| | | |
|---|---|---|
| TW | I635282 B | 9/2018 |
| TW | 202038398 A | 10/2020 |

* cited by examiner

*Primary Examiner* — Tung X Nguyen
(74) *Attorney, Agent, or Firm* — CKC & Partners Co., LLC

(57) ABSTRACT

A testing equipment includes a testing platform and a component carrying device including a carrying arm, a vacuum suction unit, a working bottom cover and a fluid transmission assembly. The carrying arm lifts and carries a device under test (DUT) onto the testing platform. The vacuum suction unit removably sucks to the DUT. The working bottom cover includes a cover body and an elastic airtight ring. The cover body is connected to the carrying arm, and the elastic airtight ring is fixedly disposed on the cover body for hermetically covering the DUT, so that a liquid filling space is collectively formed by the cover body and the DUT. The fluid transmission assembly extends into the liquid filling space for continuously passing a working liquid to the DUT and withdrawing the working liquid back away from the liquid filling space for thermally exchanging with the DUT.

19 Claims, 7 Drawing Sheets

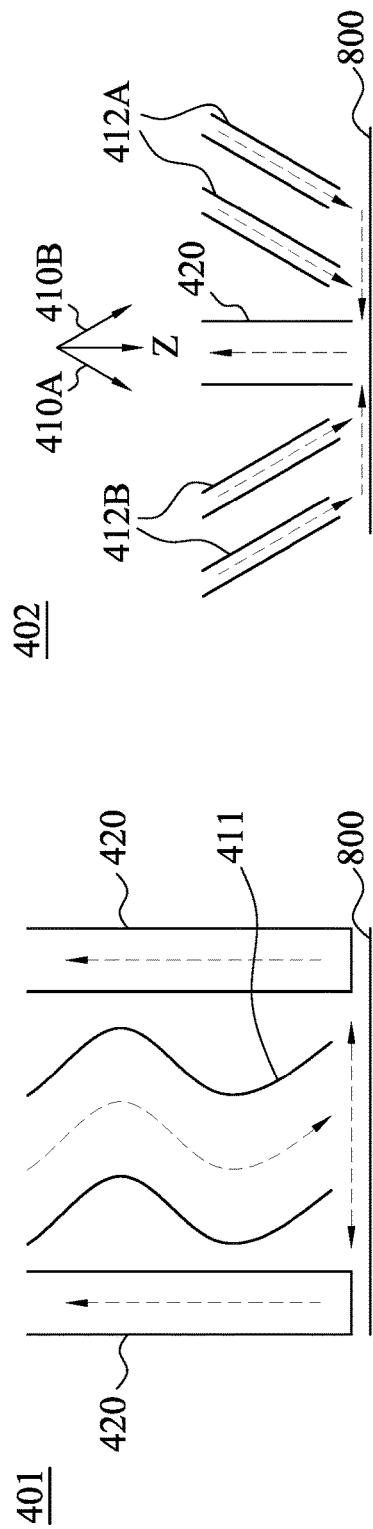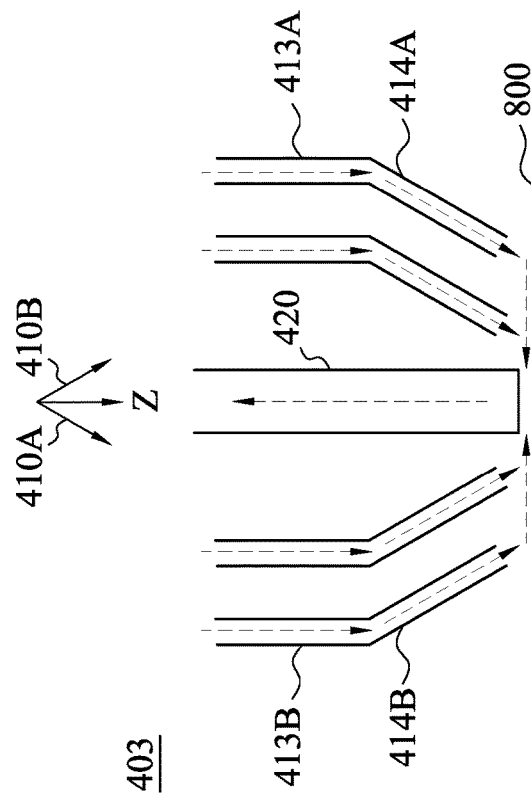

TESTING EQUIPMENT, ITS COMPONENT CARRYING DEVICE AND TESTING METHOD OF THE TESTING EQUIPMENT

RELATED APPLICATIONS

This application claims priority to Taiwan Application Serial Number 109143069, filed on Dec. 7, 2020, which is herein incorporated by reference.

BACKGROUND

Field of Disclosure

The present disclosure relates to a testing equipment. More particularly, the present disclosure relates to a testing equipment having a thermal dissipation, its component carrying device and a testing method of the testing equipment.

Description of Related Art

In general, when a semiconductor component (e.g., a semiconductor circuit chip called device under test, DUT, hereinafter) is electrically tested, the DUT is disposed on a test socket of a testing device, and a pressing head is moved downwardly to press the DUT tightly so that the DUT is ensured to be effectively electrically connected to the test socket for performing the test procedure on the DUT.

However, during the pressing head is pressed downwards the DUT tightly, heat energy will be accumulated rapidly on the DUT by the pressing head, thus not only overheating and damaging the DUT due to the thermal accumulation issue, but also causing test data of the DUT to be not accurate enough and affecting the test results.

However, during the testing process, the pressing head will quickly accumulate a lot of heat energy on the DUT so as to cause thermal accumulation issues. In addition, a thermal dissipation efficiency of the pressing head for the DUT is not good enough so that the DUT may be damaged due to overheating, which may be possibly leaded to inaccurate testing data and affect the test result.

SUMMARY

One aspect of the present disclosure is to provide a testing equipment, its component carrying device and a testing method thereof to solve the aforementioned problems of the prior art.

In one embodiment of the present disclosure, a testing equipment is provided, and includes a first vacuum suction unit, a liquid temperature control device, a testing platform and a component carrying device for lifting and carrying a device under test (DUT) onto the testing platform. The component carrying device includes a carrying arm, a vacuum suction unit, a working bottom cover and a fluid transmission assembly. The vacuum suction unit is connected to the carrying arm and the first vacuum suction unit for removably sucking to the DUT. The working bottom cover includes a cover body and an elastic airtight ring. One end of the cover body is connected to the carrying arm, and the other end of the cover body is formed with a recessed groove. The elastic airtight ring is fixedly disposed on the other end of the cover body and surrounds the recessed groove for hermetically covering a top surface of the DUT, so that a liquid filling space is collectively defined between the recessed groove and the top surface of the DUT. The fluid transmission assembly is disposed on the working bottom cover, connected to the liquid temperature control device, and partially extends into the liquid filling space. Thus, the liquid temperature control device continuously injects a working liquid to the top surface of the DUT through the fluid transmission assembly, and withdraws the working liquid away from the liquid filling space through the fluid transmission assembly, so that the working liquid and the DUT are thermally exchanged with each other.

In one embodiment of the present disclosure, a component carrying device is provided, and includes a carrying arm, a vacuum suction unit, a working bottom cover and a fluid transmission assembly. The vacuum suction unit is connected to the carrying arm for removably sucking to a device under test (DUT). The working bottom cover includes a cover body and an elastic airtight ring. One end of the cover body is connected to the carrying arm, and the other end of the cover body is formed with a recessed groove. The elastic airtight ring is fixedly disposed on the other end of the cover body and surrounds the recessed groove. The fluid transmission assembly includes a plurality of delivery pipelines respectively extending into the liquid filling space, and used to connect to a liquid temperature control device. When the elastic airtight ring hermetically covers a top surface of the DUT, a liquid filling space being in communication with the delivery pipelines is collectively defined between the recessed groove and the top surface of the DUT.

In one embodiment of the present disclosure, a testing method of a testing equipment is provided, and includes Step (a) to Step (h) as follows. In Step (a), a top surface of a device under test (DUT) is sucked through a component carrying device in a vacuum fashion; in Step (b), the top surface of the DUT is hermetically covered with the component carrying device so that a liquid filling space is collectively defined between the component carrying device and the top surface of the DUT; in Step (c), the DUT is lifted and carried onto a testing platform; in Step (d), a working liquid is injected into the liquid filling space so as to be thermally exchanged with the DUT, and then the working liquid is withdrawn away from the liquid filling space; in Step (e), the DUT is electrically tested, and a determination is made as whether a temperature of the DUT is matched within a preset standard; in Step (f), when it is determined that the temperature of the DUT is not matched within the preset standard, the step is returned back to Step (d); in Step (g), the DUT is dried in the liquid filling space after finishing electrically testing the DUT; and in Step (h), the DUT is moved to a collection zone from the testing platform.

Thus, through the construction of the embodiments above, the present disclosure pours liquid to directly contact with the DUT for directly exchanging heat with the DUT rather than multi-layers of thermal resistance. Thus, heat dissipation efficiency can be improved so as to eliminate the problem of heat accumulation.

The above description is merely used for illustrating the problems to be resolved, the technical methods for resolving the problems and their efficacies, etc. The specific details of the present disclosure will be explained in the embodiments below and related drawings.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

FIG. 4A to FIG. 4C are partially schematic views of fluid transmission assembly according to a variety of embodiments of the present disclosure.

DESCRIPTION OF THE EMBODIMENTS

Figure 1:
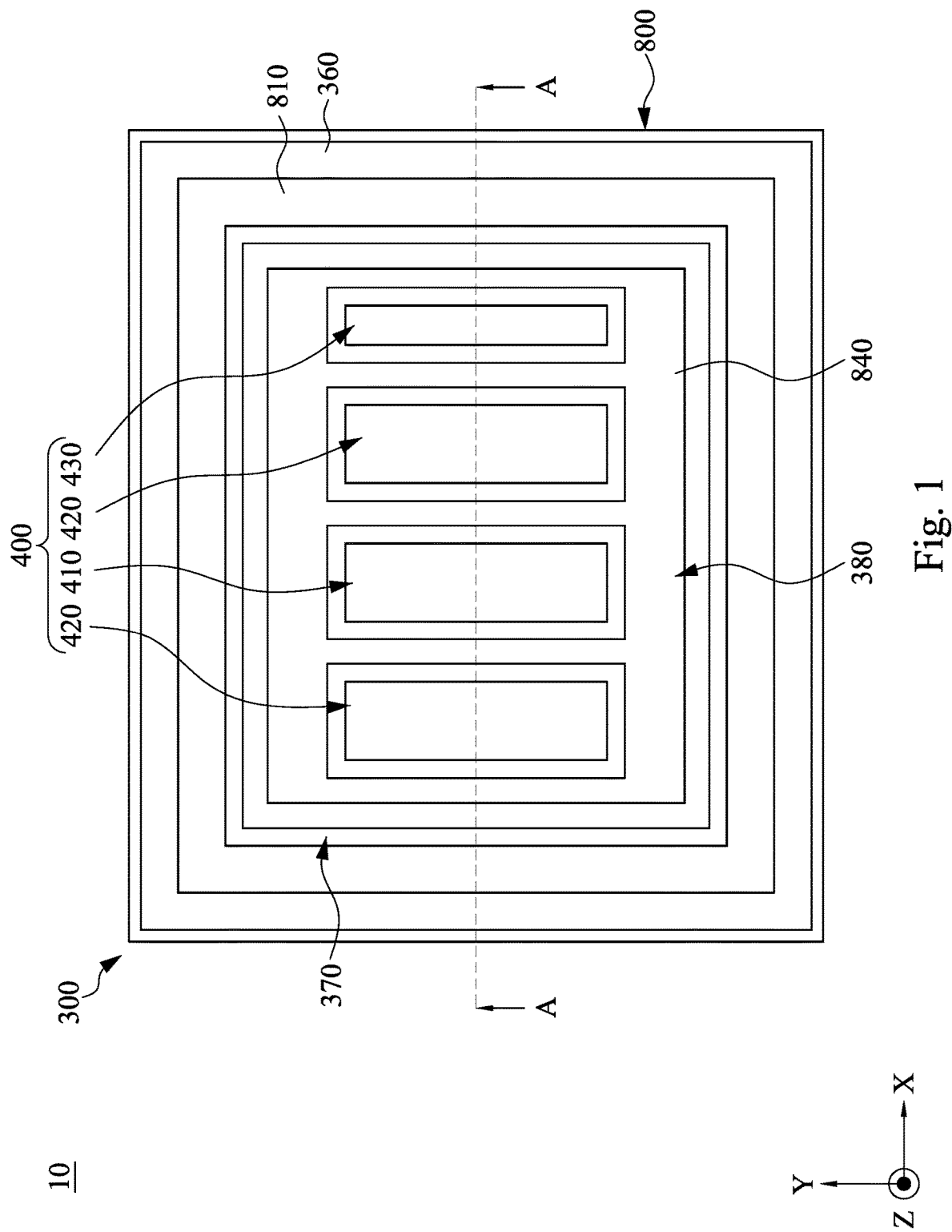
FIG. 1 is a top view of the testing equipment according to one embodiment of the present disclosure.

Reference will now be made in detail to the present embodiments of the present disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the present disclosure without departing from the scope or spirit of the present disclosure.

Figure 2:
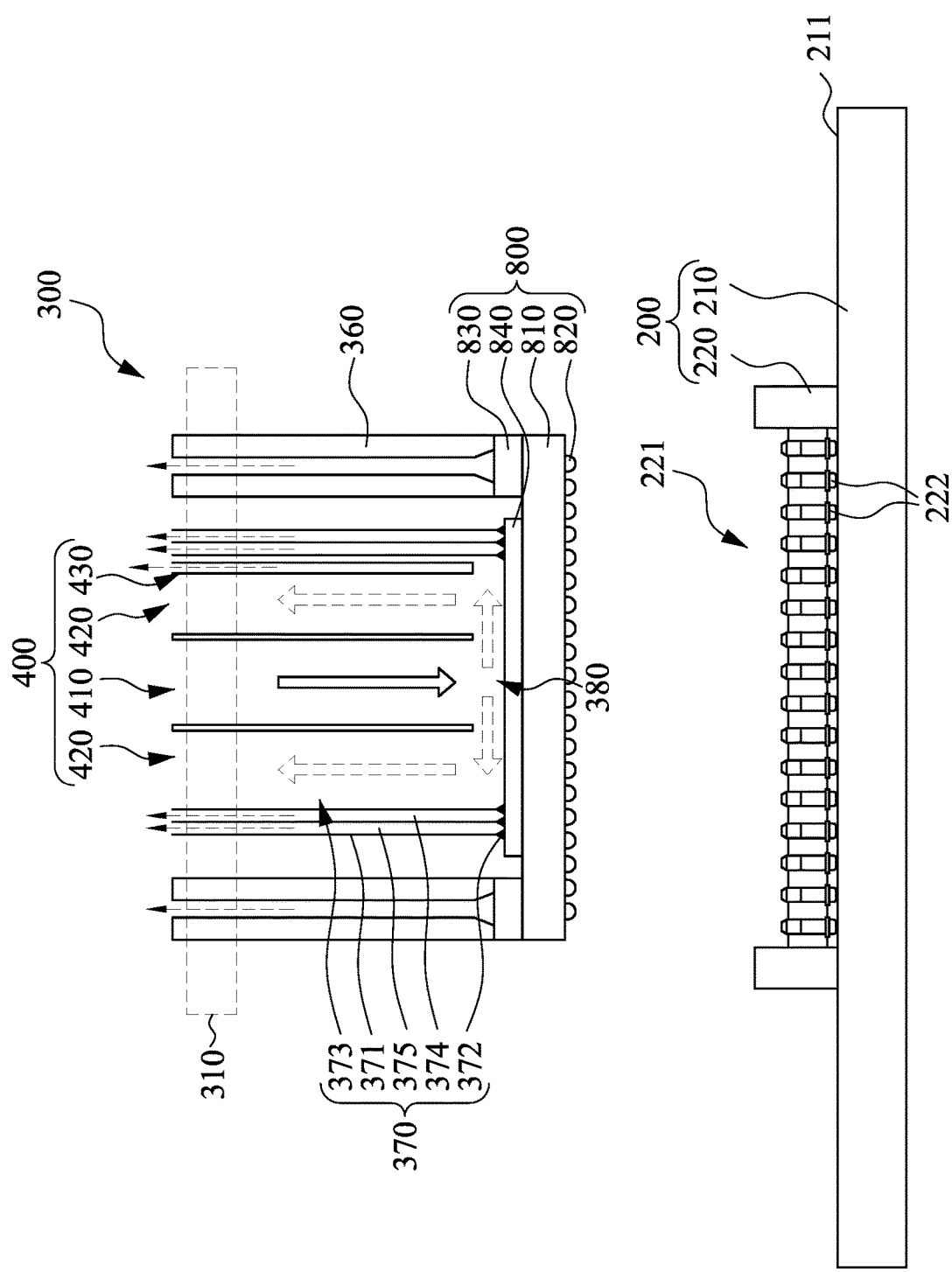
FIG. 2 is a cross-sectional view of the testing equipment of FIG. 1 viewed along a line A-A.
Figure 3:
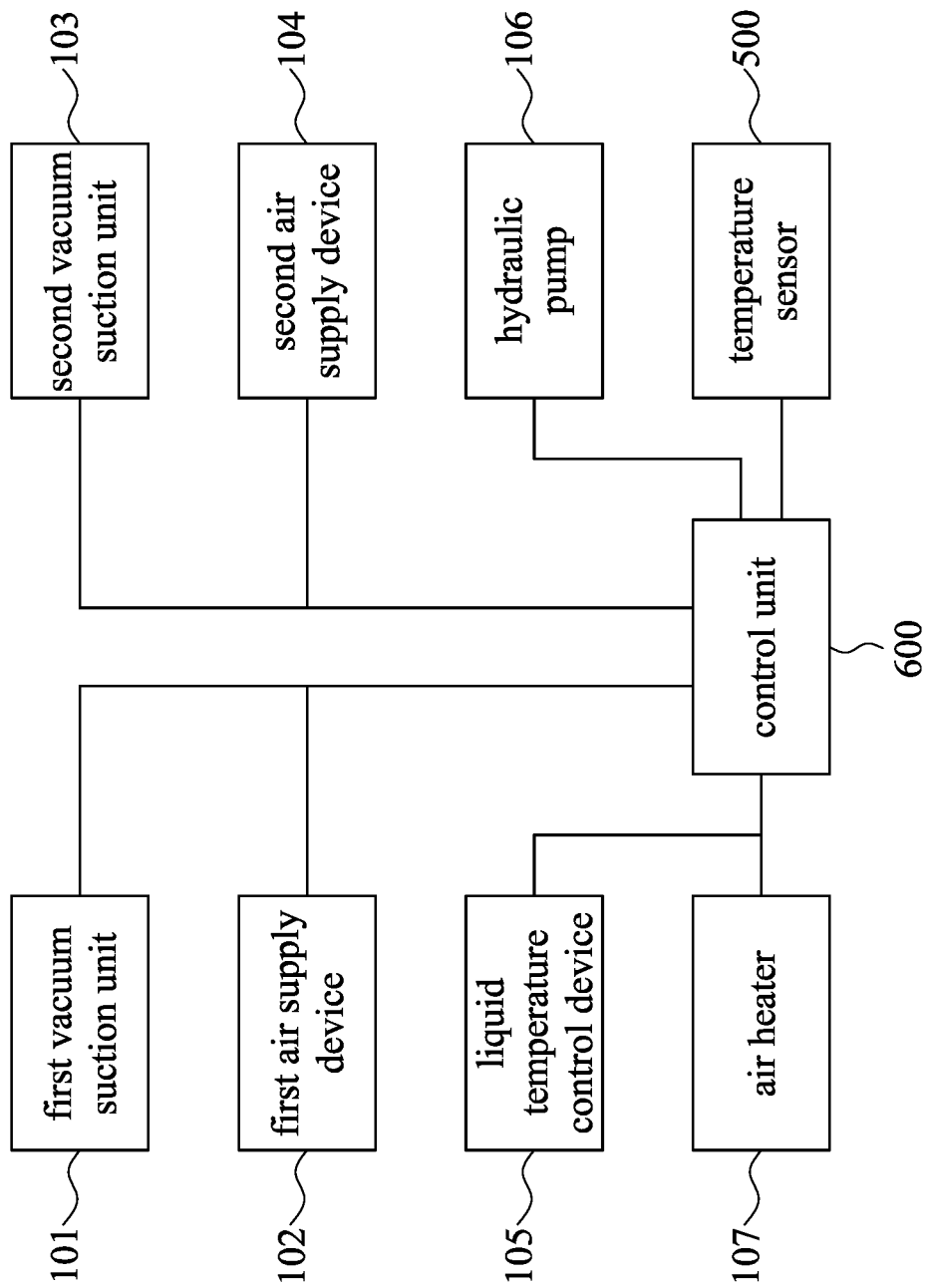
FIG. 3 is an electrical block diagram of the testing equipment of FIG. 2.

Reference is now made to FIG. 1 to FIG. 3, in which FIG. 1 is a top view of the testing equipment 10 according to one embodiment of the present disclosure, FIG. 2 is a cross-sectional view of the testing equipment 10 of FIG. 1 viewed along a line A-A, and FIG. 3 is an electrical block diagram of the testing equipment 10 of FIG. 2. As shown in FIG. 1 to FIG. 3, the testing equipment 10 includes a first vacuum suction unit 101, a first air supply device 102, a liquid temperature control device 105, a testing platform 200, a component carrying device 300, a temperature sensor 500 and a control unit 600. The first vacuum suction unit 101, the first air supply device 102 and the liquid temperature control device 105 are located neighboring to the testing platform 200. The component carrying device 300 is able to lift and carry a device under test (DUT 800, e.g., semiconductor element) onto the testing platform 200 so that the DUT 800 can be electrical tested on the testing platform 200. The temperature sensor 500 is not limited to be installed at the component carrying device 300, and used to sense the current temperature of the DUT 800. The control unit 600 is electrically connected to the first vacuum suction unit 101, the first air supply device 102, the liquid temperature control device 105, the temperature sensor 500 and the component carrying device 300, and the control unit 600 respectively controls the first vacuum suction unit 101, the first air supply device 102, the liquid temperature control device 105, the temperature sensor 500 and the component carrying device 300 to work correspondingly. The testing platform 200 includes a circuit board 210 and a testing socket 220. The testing socket 220 is disposed on a top surface 211 of the circuit board 210, and one surface of the testing socket 220 facing away from the circuit board 210 is formed with a recess 221. A connecting portion 222 conducted with the circuit board 210 is installed within the recess 221. The component carrying device 300 is movable relative to the testing platform 200 so that the component carrying device 300 is allowed to move to the above of the recess 221 of the testing socket 220 or leave from that of the recess 221 of the testing socket 220.

The component carrying device 300 includes a carrying arm 310, a vacuum suction unit 360, a working bottom cover 370 and a fluid transmission assembly 400. The vacuum suction unit 360 is connected to the carrying arm 310, the first vacuum suction unit 101 and the first air supply device 102 so that one end of the vacuum suction unit 360 is able to removably suck to a top surface of the DUT 800 thereby achieving the purpose of stably lifting and carrying the DUT 800. More specifically, when the first vacuum suction unit 101 generates negative pressure in the vacuum suction unit 360, one end of the vacuum suction unit 360 can be sucked to the top surface of the DUT 800; on the contrary, when the negative pressure in the vacuum suction unit 360 is released back to the atmospheric pressure by the first air supply device 102, the end of the vacuum suction unit 360 is no longer sucked to the top surface of the DUT 800. The working bottom cover 370 is used to cover the top surface of the DUT 800 so as to temporarily form a liquid filling space 380 capable of containing working liquid. One end of the fluid transmission assembly 400 is connected to the liquid temperature control device 105, and the other end disposed in the liquid filling space 380. Therefore, while the DUT 800 is electrically tested, the liquid temperature control device 105 continuously injects a working liquid (e.g., ionized water, see a solid arrow, FIG. 2) into the liquid filling space 380 through the fluid transmission assembly 400. After the working liquid directly contacts with the top surface of the DUT 800, the DUT 800 and the working liquid are thermally exchanged with each other. Next, the liquid temperature control device 105 continuously withdraws the working liquid away from the liquid filling space through the fluid transmission assembly 400 (See dashed arrows, FIG. 2). Thus, the DUT 800 can be controlled within a desired temperature range.

Thus, through the construction of the embodiments above, the present disclosure pours liquid to directly contact with the DUT for directly exchanging heat with the DUT rather than multi-layers of thermal resistance. Thus, heat dissipation efficiency can be improved so as to eliminate the problem of heat accumulation.

More specifically, the vacuum suction unit 360 is, for example, in a square ring shape, and is flat located on a plane defined by an axis X and an axis Y of Cartesian coordinate system, and the vacuum suction unit 360 surrounds the working bottom cover 370 and the fluid transmission assembly 400. However, the disclosure is not limited to the shape of the vacuum suction unit 360. The working bottom cover 370 includes a cover body 371 and an elastic airtight ring 372. The cover body 371 is, for example, in a square ring shape, and surrounds the fluid transmission assembly 400. However, the disclosure is not limited to the shape of the cover body 371. One end of the cover body 371 is connected to the carrying arm 310, and the other end of the cover body 371 is formed with a recessed groove 373. The elastic airtight ring 372 is fixedly disposed on the other end of the cover body 370, and the elastic airtight ring 372 surrounds the recessed groove 373. The cover body 371 is removably disposed on the top surface of the DUT 800, and the cover body 371 hermetically covers the top surface of the DUT 800 through the elastic airtight ring 372 so that the aforementioned liquid filling space 380 is collectively defined between the recessed groove 373 and the top surface of the DUT 800. The fluid transmission assembly 400 is connected to the liquid temperature control device 105, and partially extends into the liquid filling space 380.

It is noted, since the elastic airtight ring 372 hermetically presses the top surface of the DUT 800, the working liquid will not leak out between the elastic airtight ring 372 and the DUT 800, so that the working liquid can directly pour to the top surface of the DUT 800.

In the embodiment, the testing equipment 10 further includes a second vacuum suction unit 103 and a second air supply device 104. The second vacuum suction unit 103 and the second air supply device 104 are located neighboring to the testing platform 200. The working bottom cover 370 includes a vacuum inner tube 374 and a vacuum outer tube 375 which are independent to each other. The vacuum inner tube 374 is formed in the cover body 371 and arranged to surround the fluid transmission assembly 400. One end of the vacuum inner tube 374 is connected to the second vacuum suction unit 103, and the other end of the vacuum inner tube 374 runs through the elastic airtight ring 372 for removably sucking to the top surface of the DUT 800. The vacuum outer tube 375 is formed in the cover body 371 and arranged to surround the vacuum inner tube 374 and the fluid transmission assembly 400. One end of the vacuum outer tube 375 runs through the elastic airtight ring 372 for removably sucking to the top surface of the DUT 800. However, the disclosure can also omit the process of vacuum sucking the top surface of the DUT 800 through the working bottom cover 370, or the working bottom cover 370 is not limited to only the vacuum inner tube 374 or the vacuum outer tube 375.

More particularly, when the second vacuum suction unit 103 generates negative pressure in the vacuum inner tube 374 and the vacuum outer tube 375 respectively, the elastic airtight ring 372 of the working bottom cover 370 can be removably sucked to the top surface of the DUT 800; on the contrary, when the negative pressure in the vacuum inner tube 374 and the vacuum outer tube 375 is released back to the atmospheric pressure by the second air supply device 104, the vacuum inner tube 374 and the vacuum outer tube 375 are no longer sucked to the top surface of the DUT 800.

In addition to being sucked to the top surface of the DUT 800 through the vacuum suction unit 360, the working bottom cover 370 of the component carrying device 300 can also be sucked to the top surface of the DUT 800 through the vacuum inner tube 374 and the vacuum outer tube 375, thereby greatly improving the fixing ability of the DUT 800, and reducing the possibilities of the DUT 800 to be removed from the component carrying device 300.

For example, the top surface 211 of the circuit board 210 has a normal line (reference as axis Z). The fluid transmission assembly 400 includes a first delivery pipeline 410 and two second delivery pipelines 420. The first delivery pipeline 410 is disposed between the second delivery pipelines 420, and an imagery long axis direction (e.g., axis Z) of the first delivery pipeline 410 and the normal direction (e.g., axis Z) of the top surface 211 of the circuit board 210 are parallel to each other. However, the disclosure is not limited to the number and positions of the first delivery pipeline 410 and the second delivery pipelines 420.

Furthermore, one end of the first delivery pipeline 410 upwardly extending outwardly from the working bottom cover 370 connects to one connecting port (not shown in figures) of the liquid temperature control device 105, the other end thereof inserting into the recessed groove 373 has an end opening which keeps a distance with the top surface of the DUT 800. One end of each of the second delivery pipelines 420 upwardly extending outwardly from the working bottom cover 370 connects to another connecting port (not shown in figures), the other end thereof inserting into the recessed groove 373 has another end opening which keeps another distance with the top surface of the DUT 800. Thus, the working liquid can be directed to directly contact with the top surface of the DUT 800 (See the solid arrow, FIG. 2) from the first delivery pipeline 410 for absorbing heat energy, and then respectively diverted into the second delivery pipelines 420 located on both sides of the first delivery pipeline 410. At the same moment, the working liquid absorbing the heat energy can be transferred back to the liquid temperature control device 105 through the second delivery pipelines 420 (See the dashed arrows, FIG. 2).

Also, as shown in FIG. 2 and FIG. 3, the testing equipment 10 further includes a hydraulic pump 106 electrically connected to the control unit 600, and the control unit 600 controls the hydraulic pump 106 to work correspondingly. The fluid transmission assembly 400 includes at least one third delivery pipeline 430. One end of the third delivery pipeline 430 upwardly extending outwardly from the working bottom cover 370 connects to one connecting port (not shown in figures) of the hydraulic pump 106, the other end thereof inserting into the recessed groove 373 has an end opening which keeps a distance with the top surface of the DUT 800. However, the disclosure is not limited to the number of the third delivery pipeline 430. Furthermore, the third delivery pipeline 430 is arranged near an inner wall of the cover body 371, and is located between the cover body 371 and the second delivery pipelines 420 for draining the remaining part of the working liquid (See the dashed arrows, FIG. 2).

Thus, after the electrical test of the DUT 800 is finished, and the working liquid is withdrawn by the liquid temperature control device 105, the remaining part of the working liquid can be drained by the hydraulic pump 106 through the third delivery pipeline 430 (See the dashed arrows, FIG. 2). However, the disclosure can also omit the process of exhausting the remaining part of the working liquid.

Also, the testing equipment 10 further includes an air heater 107 respectively connected to the first delivery pipeline 410 and the second delivery pipeline 420, and electrically connected to the control unit 600 so that the control unit 600 can control the air heater 107 to work correspondingly. Thus, after the electrical test of the DUT 800 is finished, and the working liquid is withdrawn by the liquid temperature control device 105 (See the dashed arrows, FIG. 2), the air heater 107 starts to continuously send dry air (e.g., hot air) into the liquid filling space 380 through the first delivery pipeline 410, and continuously draw the dry air (e.g., hot air) away from the liquid filling space 380 through the second delivery pipelines 420 for drying the top surface of the DUT 800 and reducing the potential risk caused by humidity. However, the disclosure can also omit the process of drying the top surface of the DUT 800.

For example, the DUT 800 is a semiconductor element including a substrate 810, solder balls 820 and a bare die portion 840. The bare die portion 840 is mounted on a part of one surface of the substrate 810. The solder balls 820 are mounted on the other surface of the substrate 810 for connecting the aforementioned connecting portion 222. The surface of the substrate 810 is further provided with a stiffener portion 830. The vacuum suction unit 360 can be used to suck to the stiffener portion 830 of the surface of the substrate 810. The elastic airtight ring 372 of the working bottom cover 370 hermetically covers one surface of the bare die portion 840 facing away from the substrate 810. In the embodiment, an imaginary long axis direction (e.g., axis Z) of the first delivery pipeline 410 vertically directs to (i.e., passes through) a center position of the bare die portion 840.

Thus, as the semiconductor element undergoes electrical testing, comparing to the substrate 810, the bare die portion 840 will generate higher heat energy. Thus, when the liquid temperature control device 105 continuously injects the working liquid into the liquid filling space 380 through the first delivery pipeline 410, the working liquid directly contacts with the surface of the bare die portion 840 (See the solid arrow, FIG. 2), and immediately cools the bare die portion 840, thereby controlling the expected temperature of the semiconductor element.

However, in other embodiments of the disclosure, the liquid temperature control device 105 can also continuously inject high-temperature working liquid into the liquid filling space 380 to increase the expected temperature of the DUT 800.

FIG. 4A to FIG. 4C are partially schematic views of fluid transmission assembly 401-403 according to a variety of embodiments of the present disclosure. As shown in FIG. 4A, the fluid transmission assembly 401 of the embodiment is substantially the same to the fluid transmission assembly 400 of FIG. 2, however, one of differences between the fluid transmission assemblies 400 and 401 is that the first delivery pipeline 411 is in a curved shape for changing the flow direction of the working liquid (See solid curved arrow, FIG. 4A) so as to reduce a flow rate of the working liquid in the first delivery pipeline 411. Furthermore, since the first delivery pipeline 411 is nonlinear, the flow direction of the working liquid sent from the first delivery pipeline 411 is changed, so that the working liquid will not collide the DUT 800 vertically.

As shown in FIG. 4B, the fluid transmission assembly 402 of the embodiment is substantially the same to the fluid transmission assembly 400 of FIG. 2, however, one of differences between the fluid transmission assemblies 400 and 402 is that the first delivery pipelines 412A, 412B of the embodiment respectively are a number of straight pipelines inclinedly arranged within the liquid filling space 380. The first delivery pipelines 412A, 412B surround the second delivery pipeline 420, and an imaginary long axis direction of the second delivery pipeline 420 (i.e., axis Z) is parallel to the normal direction (i.e., axis Z) of the top surface 211 of the circuit board 210. The first delivery pipelines 412A on the right side of the second delivery pipeline 420 are parallel to each other, and an imaginary long axis direction 410A of each first delivery pipeline 412A on the right side of the second delivery pipeline 420 intersects an imaginary long axis direction (i.e., axis Z) of the second delivery pipeline 420. The first delivery pipelines 412B on the left side of the second delivery pipeline 420 are parallel to each other, and an imaginary long axis direction 410B of each first delivery pipeline 412B on the left side of the second delivery pipeline 420 intersects an imaginary long axis direction (i.e., axis Z) of the second delivery pipeline 420. Therefore, the first delivery pipelines 412A, 412B can reduce the flow rate of the working liquid because of the inclined configurations of the first delivery pipelines 412A, 412B, thereby reducing the collision on the top surface of the DUT 800.

As shown in FIG. 4C, the fluid transmission assembly 403 of the embodiment is substantially the same to the fluid transmission assembly 402 of FIG. 4B, however, one of differences between the fluid transmission assemblies 402 and 403 is that one end of each of the first delivery pipelines 413A is further provided with a flow-direction guiding portion 414A, and one end of each of the first delivery pipelines 413B is further provided with a flow-direction guiding portion 414B. Each of the flow-direction guiding portions 414A, 414B is used to change a flow direction of the working liquid which arrives the top surface of the DUT 800. For example, the flow-direction guiding portion 414A is an oblique part arranged at a pipe end of the first delivery pipelines 413A. The flow-direction guiding portion 414A on the right side of the second delivery pipeline 420 are parallel to each other, and the flow-direction guiding portion 414B on the left side of the second delivery pipeline 420 are parallel to each other. Each of imaginary long axis directions 410A, 410B of the flow-direction guiding portion 414A, 414B on both sides of the second delivery pipeline 420 respectively intersects with the imaginary long axis direction (i.e., axis Z) of the second delivery pipeline 420. Thus, the first delivery pipelines 413A, 413B can reduce the flow rate of the working liquid because of the guiding of the flow-direction guiding portion 414A, 414B, thereby reducing the collision on the top surface of the DUT 800.

Figure 5:
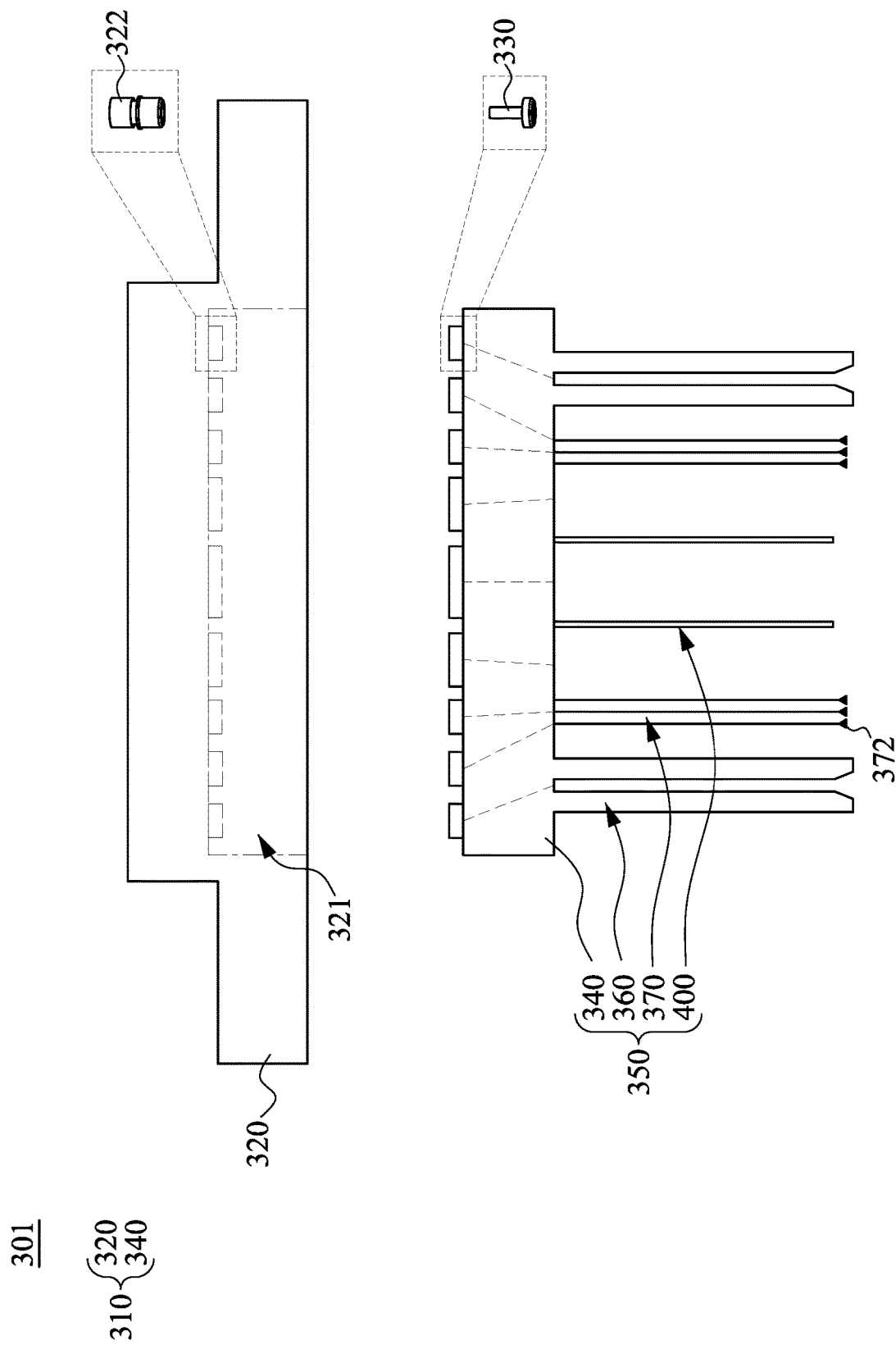
FIG. 5 is an operation view of a component carrying device according to one embodiment of the present disclosure.

FIG. 5 is an operation view of a component carrying device 301 according to one embodiment of the present disclosure. As shown in FIG. 5, in the embodiment, the carrying arm 310 includes a first unit 320 and a second unit 340. The first unit 320 is formed with a mounting groove 321 at one side of the first unit 320. The above-mentioned vacuum suction unit 360, the working bottom cover 370 and the fluid transmission assembly 400 are commonly fixedly connected to one side of the second unit 340 so that the second unit 340, the vacuum suction unit 360, the working bottom cover 370 and the fluid transmission assembly 400 collectively are called as a replaceable suction member 350. The replaceable suction member 350 is detachably installed within the mounting groove 321.

Therefore, through the air-inlet joint configurations, first air-inlet joints 330 of the replaceable suction member 350 including the vacuum suction unit 360, the working bottom cover 370 and the fluid transmission assembly 400 are respectively connected to second air-inlet joints 322 arranged in the installation groove 321 so as to quickly connect the above-mentioned first vacuum suction unit 101, the second vacuum unit 103, the liquid temperature control device 105, the hydraulic pump 106 and the air heater 107, respectively.

Thus, in response to the size of different kinds of the DUT 800, the replaceable suction member 350 including the vacuum suction unit 360, the working bottom cover 370 and the fluid transmission assembly 400 can be installed at a corresponding appropriate position of the component carrying device 300 with specific sizes so that the replaceable suction member 350 can be quickly replaced from the first unit 320.

It is noted, the first delivery pipeline 410 and the second delivery pipelines 420 in the disclosure may be real pipelines, or may be fluid channels separated by partitions.

Figure 6:
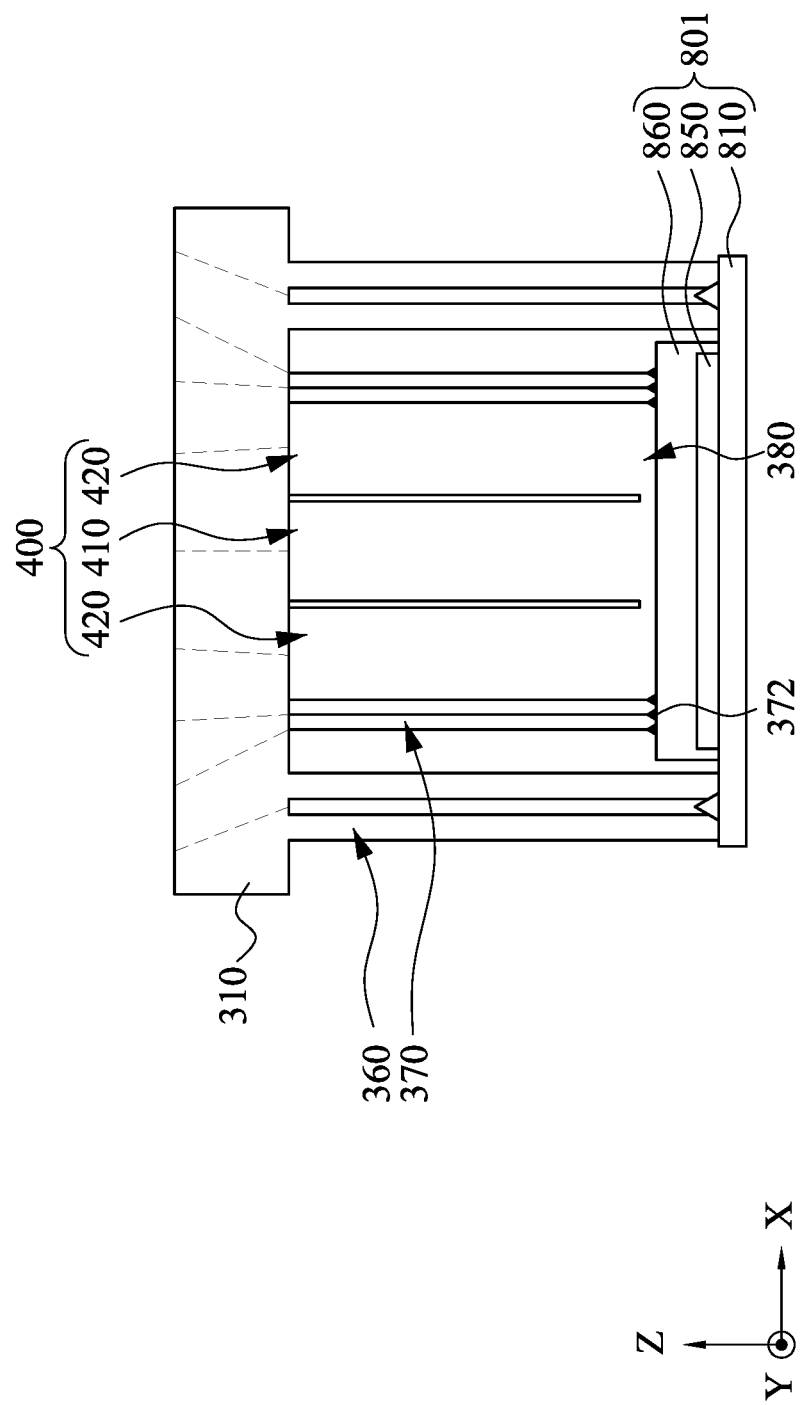
FIG. 6 is an operation view of a component carrying device according to one embodiment of the present disclosure.

FIG. 6 is an operation view of a component carrying device 300 according to one embodiment of the present disclosure. As shown in FIG. 6, the DUT 801 is a semiconductor element including a substrate 810, a bare die unit 850 and a shielding lid 860. The bare die unit 850 is mounted on a part of one surface of the substrate 810. The shielding lid 860 covers the substrate 810 and the bare die unit 850, in other words, the bare die unit 850 is sandwiched between the substrate 810 and the shielding lid 860, and thermally connected to the shielding lid. Thus, when the component carrying device 300 lifts the DUT 801, the vacuum suction unit 360 sucks on one surface of the substrate 810, and the elastic airtight ring 372 of the working bottom cover 370 hermetically presses one surface of the shielding lid 860 facing away from the substrate 810, and an imaginary long axis direction (e.g., axis Z) of the first delivery pipeline 410 vertically directs to (i.e., passes through) a center position of the bare die unit 850.

Therefore, as the semiconductor element undergoes electrical testing, comparing to the substrate 810, the higher heat energy generated from the bare die unit 850 can be quickly guided to the shielding lid 860. Thus, when the liquid temperature control device 105 continuously injects the working liquid into the liquid filling space 380 through the first delivery pipeline 410, the working liquid directly contacts with the surface of the shielding lid 860 and immediately cools the bare die unit 850, thereby controlling the expected temperature of the semiconductor element.

Figure 7:
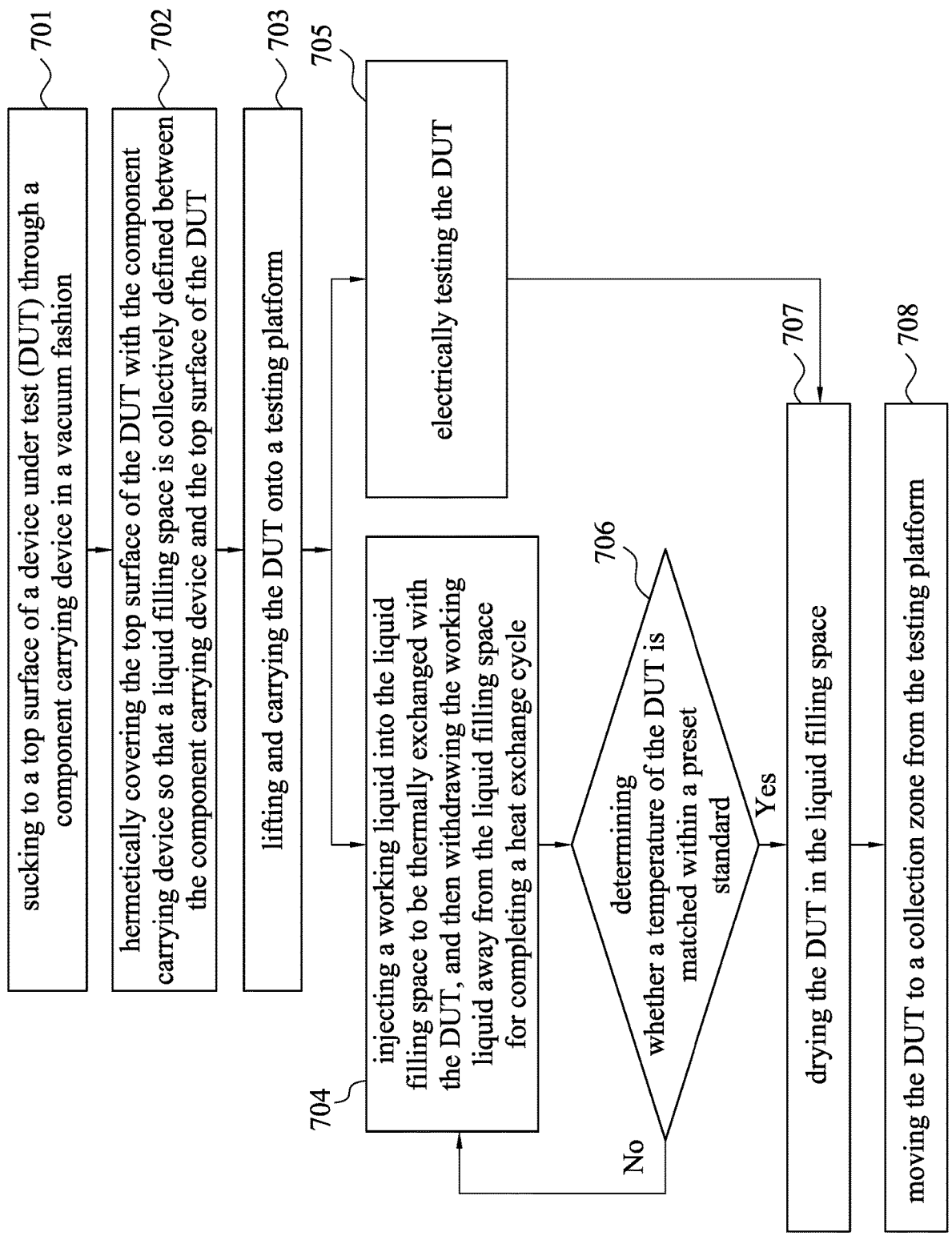
FIG. 7 is a flow chart of a testing method of a testing equipment according to one embodiment of the present disclosure.

FIG. 7 is a flow chart of a testing method of a testing equipment according to one embodiment of the present disclosure. As shown in FIG. 7, the testing method of the embodiment includes Step 701 to Step 708 as follows. In Step 701, a top surface of a device under test (DUT) is sucked through a component carrying device in a vacuum fashion. In Step 702, the top surface of the DUT is hermetically covered with the component carrying device so that a liquid filling space is collectively defined between the component carrying device and the DUT. In Step 703, the DUT is lifted and carried onto a testing platform. In Step 704, a working liquid is injected into the liquid filling space to be thermally exchanged with the DUT, and then the working liquid is withdrawn away from the liquid filling space for completing a heat exchange cycle, and then proceed to Step 706. In Step 705, the DUT is electrically tested, and then proceed Step 707 when the electrically testing is finished. In Step 706, a determination is made as whether a temperature of the DUT is matched within a preset standard, if yes, proceed Step 707, otherwise back to Step 704. In Step 707, the DUT is dried in the liquid filling space. In Step 708, the DUT is moved to a collection zone from the testing platform.

In this embodiment, Step 701 and Step 702 of the aforementioned testing method can be completed simultaneously. More specifically, as shown in FIG. 2, the vacuum suction unit 360 and the working bottom cover 370 are simultaneously sucked the top surface of the DUT 800 through a vacuum fashion. However, the disclosure is not limited thereto, in another embodiments, Step 702 may be completed before Step 701.

In this embodiment, in Step 707 of the aforementioned testing method further includes detailed steps as follows. Firstly, the remaining part of the working liquid in the liquid filling space is drained; next, dry air is sent into the liquid filling space to dry the top surface of the DUT; and then the dry air is drawn away from the liquid filling space.

In the embodiment, after Step 708 is performed, the aforementioned testing method further includes detailed steps as follows. The negative pressure in the vacuum inner tube 374 and the vacuum outer tube 375 of the working bottom cover 370 is released back to the atmospheric pressure so that the working bottom cover 370 is removable from the top surface of the DUT 800; next, the negative pressure in the vacuum suction unit 360 of the component carrying device 300 is released back to the atmospheric pressure so that the vacuum suction unit 360 is removable from the top surface of the DUT 800.

It is noted, the thermal exchanging described above refers to that the working liquid directly contacts the DUT, so that heat energy can be effectively transferred to the DUT or the working liquid, so as to achieve the purpose of adjusting the temperature of the DUT.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A testing equipment, comprising:
 a first vacuum suction unit;
 a liquid temperature control device;
 a testing platform; and
 a component carrying device for lifting and carrying a device under test (DUT) onto the testing platform, and the component carrying device comprising:
  a carrying arm;
  a vacuum suction unit connected to the carrying arm and the first vacuum suction unit for removably sucking to the DUT;
  a working bottom cover comprising a cover body and an elastic airtight ring, one end of the cover body being connected to the carrying arm, and the other end of the cover body being formed with a recessed groove, and the elastic airtight ring being fixedly disposed on the other end of the cover body and surrounding the recessed groove for hermetically covering a top surface of the DUT, so that a liquid filling space is collectively defined between the recessed groove and the top surface of the DUT; and
  a fluid transmission assembly disposed on the working bottom cover, connected to the liquid temperature control device, and partially extending into the liquid filling space,
 wherein the liquid temperature control device continuously injects a working liquid to the top surface of the DUT through the fluid transmission assembly, and withdraws the working liquid away from the liquid filling space through the fluid transmission assembly, so that the working liquid and the DUT are thermally exchanged with each other.

2. The testing equipment of claim 1, further comprising a second vacuum suction unit, and the working bottom cover further comprising a vacuum inner tube formed in the cover body and arranged to surround the fluid transmission assembly, wherein one end of the vacuum inner tube is connected to the second vacuum suction unit, and the other end of the vacuum inner tube runs through the elastic airtight ring for removably sucking to the top surface of the DUT.

3. The testing equipment of claim 2, wherein the working bottom cover further comprising a vacuum outer tube formed in the cover body, and one end of the vacuum outer tube is connected to the second vacuum suction unit, and the other end of the vacuum outer tube runs through the elastic airtight ring for removably sucking to the top surface of the DUT, wherein the vacuum outer tube surrounds the vacuum inner tube and the fluid transmission assembly.

4. The testing equipment of claim 1, wherein the fluid transmission assembly comprising at least one first delivery pipeline and at least one second delivery pipeline, one end of the first delivery pipeline is disposed within the recessed groove, the other end of the first delivery pipeline is connected to the liquid temperature control device for guiding the working liquid into the liquid filling space, and one end of the second delivery pipeline is disposed within the recessed groove, the other end of the second delivery pipeline is connected to the liquid temperature control device for guiding the working liquid away from the liquid filling space.

5. The testing equipment of claim 4, wherein when the at least one second delivery pipeline is plural in number, the at least one first delivery pipeline is located between the second delivery pipelines.

6. The testing equipment of claim 4, further comprising a hydraulic pump, and the fluid transmission assembly comprising at least one third delivery pipeline, one end of the third delivery pipeline is disposed within the recessed groove, the other end of the third delivery pipeline is connected to the hydraulic pump,
wherein after a part of the working liquid is drawn back by the liquid temperature control device, a remaining part of the working liquid is drained by the hydraulic pump through the third delivery pipeline.

7. The testing equipment of claim 4, further comprising:
an air heater connected to the first delivery pipeline and the second delivery pipeline,
wherein the air heater continuously sends dry air into the liquid filling space through the first delivery pipeline, and draws the dry air away from the liquid filling space through the second delivery pipeline.

8. The testing equipment of claim 4, wherein an imaginary long axis direction of the first delivery pipeline vertically passes through the top surface of the DUT.

9. The testing equipment of claim 4, wherein the first delivery pipeline is in a curved shape for reducing a flow rate of the working liquid.

10. The testing equipment of claim 4, wherein one end of the first delivery pipeline is further provided with a flow-direction guiding portion used to change a flow direction of the working liquid which arrives the top surface of the DUT.

11. The testing equipment of claim 4, wherein the DUT is a semiconductor element comprising a substrate and a bare die portion mounted on the substrate, wherein the vacuum suction unit sucks to one surface of the substrate, and the elastic airtight ring hermetically covers one surface of the bare die portion facing away from the substrate, and an imaginary long axis direction of the first delivery pipeline passes through a center position of the bare die portion.

12. The testing equipment of claim 4, wherein the DUT is a semiconductor element comprising a substrate, a shielding lid, and a bare die unit mounted between the substrate and the shielding lid and thermally connected to the shielding lid,
wherein the vacuum suction unit sucks to one surface of the substrate, and the elastic airtight ring hermetically covers one surface of the shielding lid facing away from the substrate, and an imaginary long axis direction of the first delivery pipeline passes through a center position of the bare die unit.

13. A component carrying device, comprising:
a carrying arm;
a vacuum suction unit connected to the carrying arm for removably sucking to a device under test (DUT);
a working bottom cover comprising a cover body and an elastic airtight ring, one end of the cover body being connected to the carrying arm, and the other end of the cover body being formed with a recessed groove, and the elastic airtight ring being fixedly disposed on the other end of the cover body and surrounding the recessed groove; and
a fluid transmission assembly comprising a plurality of delivery pipelines respectively extending into the liquid filling space, and used to connect to a liquid temperature control device,
wherein when the elastic airtight ring hermetically covers a top surface of the DUT, a liquid filling space being in communication with the delivery pipelines is collectively defined between the recessed groove and the top surface of the DUT.

14. The component carrying device of claim 13, wherein the working bottom cover further comprises:
a vacuum inner tube formed in the cover body and arranged to surround the fluid transmission assembly, wherein one end of the vacuum inner tube runs through the elastic airtight ring for removably sucking to the top surface of the DUT; and
a vacuum outer tube formed in the cover body and arranged to surround the vacuum inner tube and the fluid transmission assembly, wherein one end of the vacuum outer tube runs through the elastic airtight ring for removably sucking to the top surface of the DUT.

15. The component carrying device of claim 13, wherein one of the delivery pipelines is in a curved shape.

16. The component carrying device of claim 13, wherein one of the delivery pipelines is further provided with a flow-direction guiding portion.

17. A testing method of a testing equipment, comprising:
(a) sucking to a top surface of a device under test (DUT) through a component carrying device in a vacuum fashion;
(b) hermetically covering the top surface of the DUT with the component carrying device so that a liquid filling space is collectively defined between the component carrying device and the top surface of the DUT;
(c) lifting and carrying the DUT onto a testing platform;
(d) injecting a working liquid into the liquid filling space so as to be thermally exchanged with the DUT, and then withdrawing the working liquid away from the liquid filling space;
(e) electrically testing the DUT, and determining whether a temperature of the DUT is matched within a preset standard;
(f) returning back to Step (d) when it is determined that the temperature of the DUT is not matched within the preset standard;
(g) drying the DUT in the liquid filling space after the DUT being electrically tested is finished; and
(h) moving the DUT to a collection zone from the testing platform.

18. The testing method of claim 17, wherein Step (a) and Step (b) are completed simultaneously.

19. The testing method of claim 17, wherein Step (g) further comprising:
draining the remaining part of the working liquid in the liquid filling space; and
sending dry air into the liquid filling space to dry the top surface of the DUT, and drawing the dry air away from the liquid filling space.

* * * * *